United States Patent
Su

(10) Patent No.: US 7,362,570 B2
(45) Date of Patent: Apr. 22, 2008

(54) WATER-PROOF HOUSING FOR ELECTRONIC EQUIPMENT

(75) Inventor: I-Wen Su, Taoyuan (TW)

(73) Assignee: Benq Corporation, Kweishan, Taoyuan (TW)

( * ) Notice: Subject to any disclaimer, the term of this patent is extended or adjusted under 35 U.S.C. 154(b) by 0 days.

(21) Appl. No.: 11/614,172

(22) Filed: Dec. 21, 2006

(65) Prior Publication Data
US 2007/0146989 A1 Jun. 28, 2007

(30) Foreign Application Priority Data
Dec. 28, 2005 (TW) .............................. 94146886 A

(51) Int. Cl.
*G06F 1/16* (2006.01)
(52) U.S. Cl. ...................... 361/687; 224/673; 381/367; 348/375
(58) Field of Classification Search ................ 224/222, 224/673, 236, 257; 381/355, 361, 367; 386/46; 348/375; 361/679–687, 724–727
See application file for complete search history.

(56) References Cited

U.S. PATENT DOCUMENTS

| 6,188,773 | B1 * | 2/2001 | Murata et al. ............... 381/361 |
| 6,808,288 | B2 * | 10/2004 | Mah .......................... 362/192 |
| 2005/0254778 | A1 * | 11/2005 | Pettersen et al. ............. 386/46 |
| 2007/0215663 | A1 * | 9/2007 | Chongson et al. .......... 224/930 |

* cited by examiner

*Primary Examiner*—Hung Van Duong
(74) *Attorney, Agent, or Firm*—Hoffman, Warnick & D'Alessandro LLC

(57) ABSTRACT

The invention provides a water-proof housing for an electronic equipment. The water-proof housing, according to the invention, has built-in drainage to cope with penetration of liquid into the electronic equipment. The water-proof housing essentially includes a main body with a plurality of ventilation holes formed thereon. The housing also includes a plurality of drainpipes which each corresponds to one of the ventilation holes and a collecting hopper is formed at one end thereof. The drainpipes are mounted on an inner wall of the main body such that each of the collecting hoppers is disposed underneath the corresponding ventilation hole. Once liquid flows into the interior of the electronic equipment through the ventilation holes, the liquid is collected by the collecting hoppers and drained out of the electronic equipment from an outlet.

10 Claims, 4 Drawing Sheets

WATER-PROOF HOUSING FOR ELECTRONIC EQUIPMENT

BACKGROUND OF THE INVENTION

1. Field of the Invention

This present invention relates to a water-proof housing for an electronic equipment, and more particularly, to a housing having a built-in drainage to cope with the penetration of water into the electronic equipment.

2. Description of the Prior Art

As modern technology advances, a variety of electronic equipments are playing more and more important roles in people's everyday life. Electronic equipments are usually placed where they are accessible, e.g. desktops. On the other hand, these electronic equipments are also not well protected under such environments. For example, someone might accidentally splash a cup of tea on these machines. The machines may include various electronic elements within the housing, such as semiconductor devices, capacitors, resistors, and integrated circuits. These electronic elements are further mounted on substrates or carriers made of PCB, epoxy-glass fiber, ceramics, or other materials. It is important that water or atmospheric water vapor is eliminated from the interior of the housing, in order to prevent corrosion and to retain high level insulation of the electronic elements and of the carriers or substrates. Hermetically sealing the housing, though achieving the purpose of avoiding the above problems, often leads to cooling difficulties, and thus is commercially not suitable. As shown in FIG. 1A, a housing for an electronic equipment of the prior art with ventilation holes 14 thereon is depicted. FIG. 1B is a cross sectional diagram along the A-A line of the housing shown in FIG. 1A. Ventilating the housing effectively not only regulates the interior temperature and humidity of the electronic equipment, but it also provides a means of dissipating the heat generated by the electronic equipment. However, the penetration of water or other liquids through the ventilation holes might cause serious damage to the electronic elements within the equipment.

Accordingly, for electronic equipment, there is a need for a water-proof housing including ventilation holes thereon, as well as drainage, for dealing with the penetration of water into the housing.

SUMMARY OF THE INVENTION

Accordingly, one scope of the present invention is to provide a water-proof housing, for an electronic equipment, with ventilation holes thereon.

Another scope of the invention is to provide a water-proof housing, for an electronic equipment, with built-in drainage to cope with the penetration of water into the electronic equipment.

According to a preferred embodiment of the invention, the water-proof housing for an electronic equipment includes a main body, a plurality of formed-through ventilation holes, a plurality of drainpipes, and at least one outlet. The main body, which has a top and a bottom, shields the interior of the electronic equipment. The formed-through ventilation holes are formed near the top of the main body. Each of the drainpipes, which corresponds to one of the ventilation holes, has a collecting hopper formed at one end thereof and an exit formed at the other end thereof. The drainpipes are mounted on an inner wall of the main body such that each of the collecting hoppers is disposed underneath the corresponding ventilation hole. The outlet is formed near the bottom of the main body. The exit of each drainpipe is coupled to the outlet. Once liquid flows into the interior of the electronic equipment through the ventilation holes, the liquid is collected by the collecting hoppers and drained out of the electronic equipment from the outlet.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
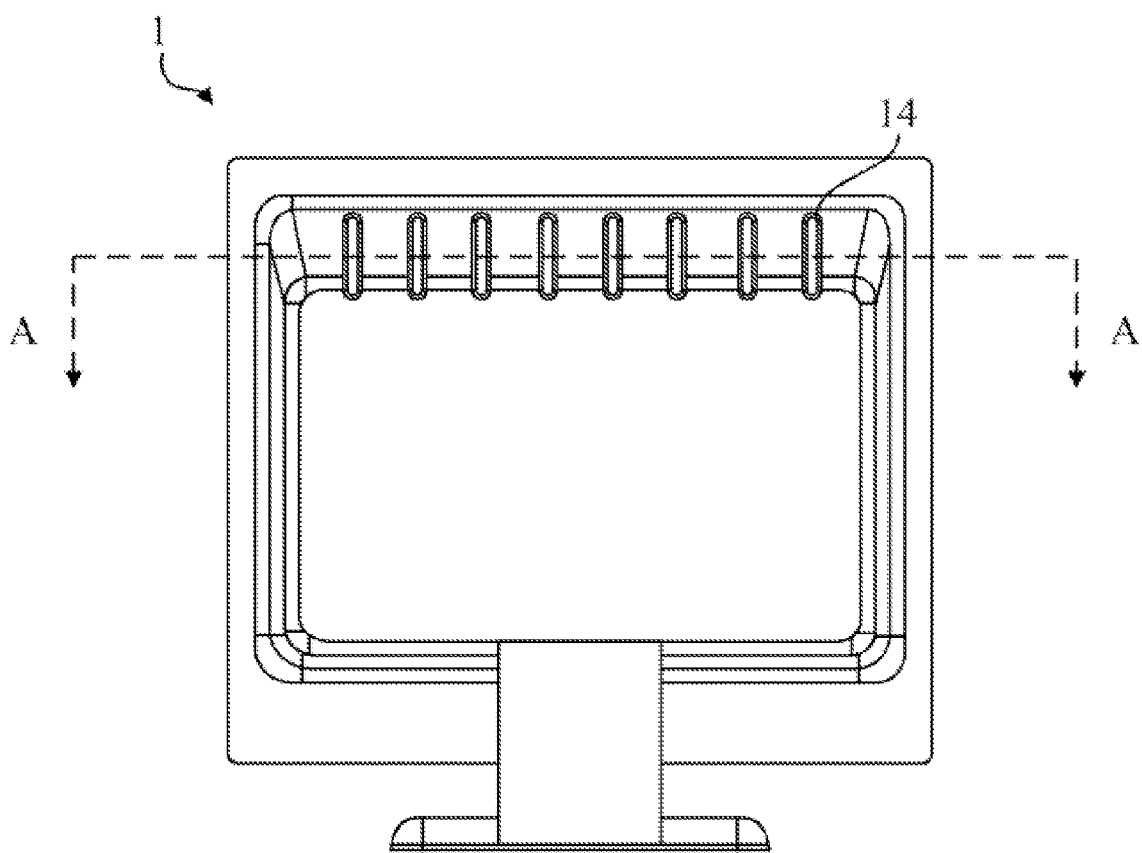
FIG. 1A illustrates a housing for an electronic equipment with ventilation structures thereon.
Figure 1B:
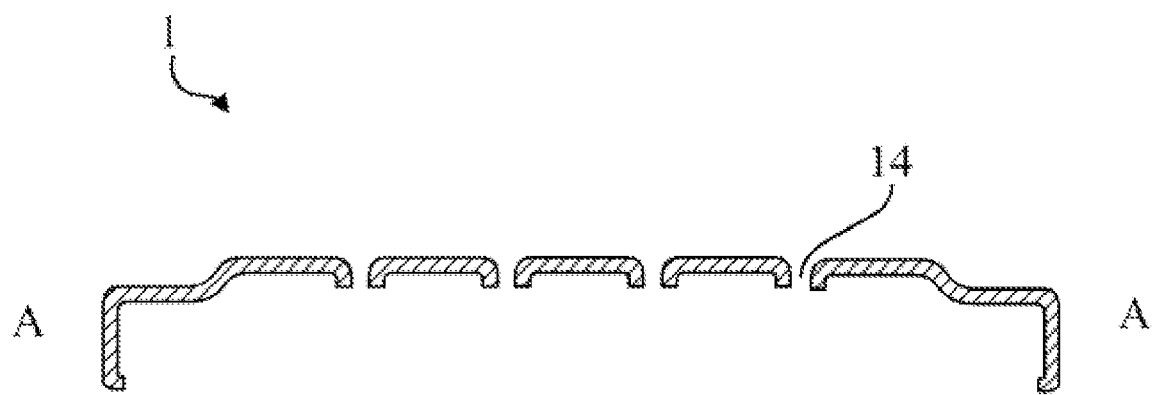
FIG. 1B is a cross sectional diagram along the A-A line of the housing shown in FIG. 1A.
Figure 2A:
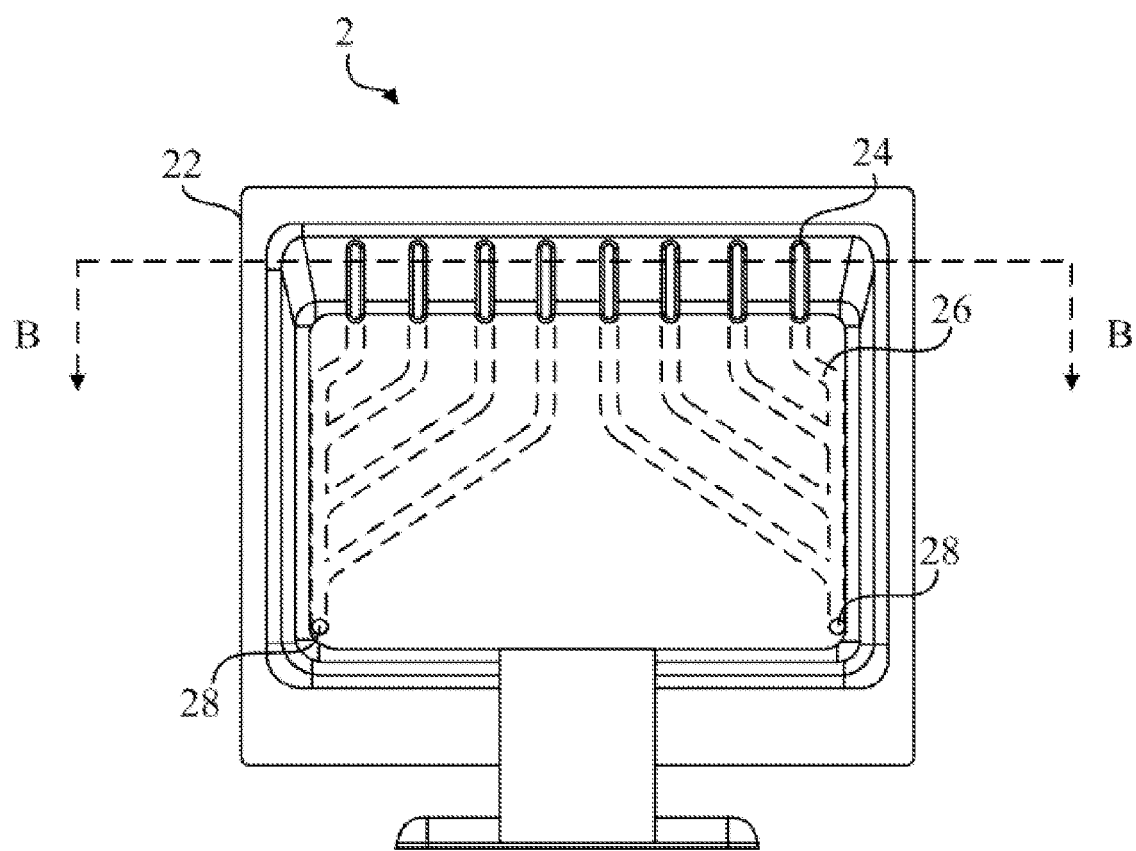
FIG. 2A illustrates a back view of the water-proof housing according to a preferred embodiment of the invention.

Referring to FIG. 2A, a back view of the water-proof housing 2, according to a preferred embodiment of the invention, is illustrated. Particularly, the water-proof housing 2 prevents the interior of an electronic equipment from damages caused by the penetration of water. In an embodiment, the electronic equipment is a CRT (Cathode ray tube) or LCD (Liquid-crystal display) monitor. As shown in FIG. 2A, the water-proof housing 2 includes a main body 22, a plurality of formed-through ventilation holes 24, a plurality of drainpipes 26, and at least one outlet 28.

The main body 22, which has a top and a bottom, shields the interior of the electronic equipment. The formed-through ventilation holes 24 are formed near the top of the main body 22. Of course the ventilation holes 24 can also be formed at the top of the main body 22. Each of the drainpipes 26 corresponds to one of the ventilation holes 24, and has an exit formed at one end thereof. The water-proof housing 2 also includes a plurality of collecting hoppers 260 (shown in FIG. 2B). Each of the collecting hoppers 260 is formed at another end of one of the drainpipes 26. The drainpipes 26 are mounted on an inner wall of the main body 22 such that each of the collecting hoppers 260 is disposed underneath the corresponding ventilation hole 24.

Figure 2B:
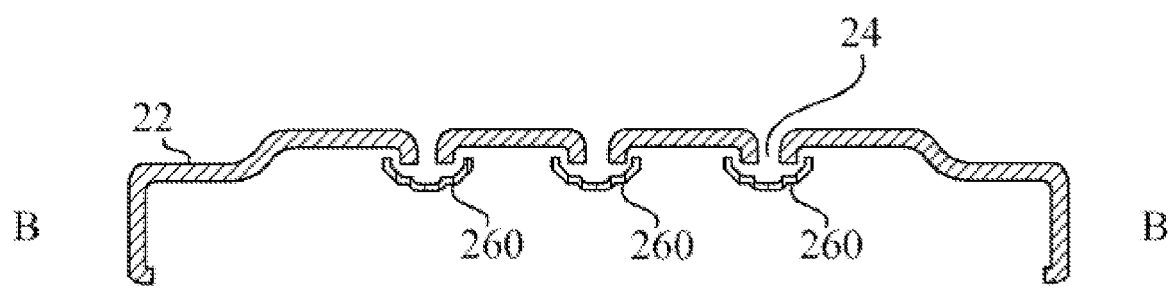
FIG. 2B depicts a cross sectional diagram along the B-B line of the water-proof housing shown in FIG. 2A.

In practical applications, the ventilation holes 24 can be implemented in a variety of forms, such as round holes or elongated gaps. The collecting hoppers 260 should be able to adapt to the ventilation holes 24 on the premise that the opening of each collecting hopper 260 can cover the corresponding ventilation hole 24. Referring to FIG. 2B, a cross sectional diagram along the B-B line of the water-proof housing 2 shown in FIG. 2A is illustrated. In an embodiment, as shown in FIG. 2B, the opening of each collecting hopper 260 is larger than the corresponding ventilation hole 24. Besides, each collecting hopper 260 is disposed in a proper distance underneath the corresponding ventilation hole 24, so as to keep the passages for air circulation and heat dissipation fluent.

The outlet 28 is formed near the bottom of the main body 22. Of course the outlet 28 can also be formed at the bottom of the main body 22. The exit of each drainpipe 26 is coupled to the outlet 18. Once liquid flows into the interior of the electronic equipment through the ventilation holes 24, the liquid is collected by the collecting hoppers 260 and drained out of the electronic equipment from the outlet 28.

Obviously, the water-proof housing according to the invention can be applied to other electronic equipments, such as projectors or the like, which need ventilation and thus are vulnerable to the penetration of water or other liquids. By incorporating drainage into the housing, the liquids penetrating into the housing are collected immediately and drained out of the housing, so as to protect the electronic elements therein.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A water-proof housing for an electronic equipment, comprising:
    a main body configured to protect the electronic equipment;
    a plurality of ventilation holes formed through and on the main body;
    a plurality of drainpipes which each corresponds to one of the ventilation holes and has an exit formed at one end thereof; and
    a plurality of collecting hoppers which each is formed at another end of one of the drainpipes, wherein the drainpipes are mounted on an inner wall of the main body such that each of the collecting hoppers is disposed underneath the corresponding ventilation hole;
    wherein once a liquid flows into the interior of the electronic equipment through the ventilation holes, the liquid is collected by the collecting hoppers.

2. The water-proof housing of claim 1, wherein the main body has a top, and the ventilation holes are formed near the top of the main body.

3. The water-proof housing of claim 2, wherein the main body has a bottom, and the water-proof housing further comprises:
    at least one outlet formed near the bottom of the main body, the exit of each drainpipe being coupled to the outlet;
    wherein the liquid collected by the collecting hoppers is drained out of the main body from the outlet.

4. The water-proof housing of claim 3, wherein each of the collecting hoppers has an opening covering the corresponding ventilation hole.

5. The water-proof housing of claim 3, wherein the electronic equipment is a monitor.

6. The water-proof housing of claim 3, wherein the electronic equipment is a projector.

7. A monitor, comprising:
    a housing configured to protect the monitor;
    a plurality of ventilation holes formed through and on the housing;
    a plurality of drainpipes which each corresponds to one of the ventilation holes and has an exit formed at one end thereof; and
    a plurality of collecting hoppers which each is formed at another end of one of the drainpipes, wherein the drainpipes are mounted on an inner wall of the main body such that each of the collecting hoppers is disposed underneath the corresponding ventilation hole;
    wherein once a liquid flows into the interior of the monitor through the ventilation holes, the liquid is collected by the collecting hoppers.

8. The monitor of claim 7, wherein the housing has a top, and the ventilation holes are formed near the top of the housing.

9. The monitor of claim 8, wherein the main body has a bottom, and the water-proof housing further comprises:
    at least one outlet formed near the bottom of the housing, the exit of each drainpipe being coupled to the outlet;
    wherein the liquid collected by the collecting hoppers is drained out of the housing from the outlet.

10. The monitor of claim 9, wherein each of the collecting hoppers has an opening covering the corresponding ventilation hole.

* * * * *